United States Patent [19]
Lightfoot

[11] Patent Number: 5,841,680
[45] Date of Patent: Nov. 24, 1998

[54] RANDOM PULSE GENERATION

[75] Inventor: John Adrian Lightfoot, Cumbria, United Kingdom

[73] Assignee: British Nuclear Fuels PLC, Cheshire, United Kingdom

[21] Appl. No.: 508,812

[22] Filed: Jul. 28, 1995

[51] Int. Cl.[6] ........................................................ G06F 1/02
[52] U.S. Cl. ........................................................ 364/717.03
[58] Field of Search ................................ 364/717, 717.5, 364/717.03; 371/27

[56] References Cited

U.S. PATENT DOCUMENTS

| | | | |
|---|---|---|---|
| 3,790,768 | 2/1974 | Chevalier et al. | 235/152 |
| 3,946,215 | 3/1976 | May | 364/717 |
| 4,173,000 | 10/1979 | Singer et al. | 364/717 |
| 4,951,243 | 8/1990 | Tomlinson, Jr. | 364/717 |
| 5,153,532 | 10/1992 | Albers et al. | 331/78 |
| 5,175,798 | 12/1992 | Taylor et al. | 364/717 |

FOREIGN PATENT DOCUMENTS

| | | |
|---|---|---|
| 0 113 181 A1 | 7/1984 | European Pat. Off. . |
| 1 322 915 | 7/1973 | United Kingdom . |
| 1 517 274 | 7/1978 | United Kingdom . |

OTHER PUBLICATIONS

Lightfoot, J.A., et al., A Computer Controlled, High Performance, Neutron Coincidence Counting System, *Nuclear Instruments and Methods in Physics Research*, A271, 636–643, (1988).

*Primary Examiner*—David H. Malzahn
*Attorney, Agent, or Firm*—Fish & Richardson, P.C.

[57] ABSTRACT

A logic circuit monitors the outputs of R, F and T probability generators, provides an output pulse, and increments or decreases a counter, the output of which is fed back to the T probability generator. R represents the rate or frequency of a random background, F represents the fraction of events in the random background R that will have associated coincident pairs, and T a respective die-away time. The parameters R, F and T are decided by the user. Such a pulse generator may simulate the output from a neutron well, and may be used to test neutron coincidence systems in a simple and rigorous manner.

28 Claims, 2 Drawing Sheets

RANDOM PULSE GENERATION

This invention relates to random pulse generation, and is concerned particularly, although not exclusively, with the testing of neutron coincidence systems.

The technique of neutron coincidence counting has found many applications, and has been designed to implement the algorithm of Bohnel [K Bohnel, AWRE translation No 7 (54/4252) (March 1978)] on a pulse stream from neutron counting wells. These have been produced for measuring waste in packets, drums and crates as well as plutonium in bulk quantities.

Until recently, however, there has been no pulse generator available which will simulate the output from a neutron well. This has made the testing of neutron coincidence systems difficult and less rigorous than would be desired. Preferred embodiments of the present invention aim to provide new pulse generators which can be used to test these systems.

An output from detectors in a neutron coincidence well comprises a stream of logic pulses with a mean rate R but which are randomly distributed in time. Typically, the pulses are 50 nsec long and R is in the range 0 to 1 MHz. As some of the pulses in the stream are produced by fission events, they occur in pairs or, less frequently, triplets. A moderator in the well causes the neutrons to be thermalised and eventually detected by proportional counters embedded in the moderator. This may take from 20 to 300 microseconds, depending on the shape and size of the well. When they are detected, the neutrons are no longer coincident; indeed they may be separated by many tens of microseconds. They are still correlated, however, and information on the coincidence rate can still be extracted by the electronics, despite the correlated events being distributed within the random continuum.

The pulse stream thus has two components. The first comprises the random continuum and the second comprises the pairs or triplets. The triplets are rare events from conventional neutron wells, as the neutron counting efficiency, E, is usually only a few percent. Thus, the pair efficiency is $E^2$ and the triplet efficiency is $E^3$.

The time between one correlated pair and the next is random and has a mean frequency P. The time between the individual members of pairs is also random and is distributed exponentially. The time constant of this interval is known as the die-away time T and is a characteristic of the well's construction.

According to one aspect of the present invention, there is provided a pulse generator comprising:

a first probability generator for generating a first output comprising pulses which are output with a first probability;

a second probability generator for generating a second output comprising pulses which are output with a second probability; and a logic circuit for combining the outputs of said first, second and third probability generators to produce an output pulse in dependence upon the states of the outputs of said probability generators.

A pulse generator as above may further comprise a third probability generator for generating a third output comprising pulses which are output with a third probability; the logic circuit being arranged to combining the outputs of said first, second and third probability generators to produce an output pulse in dependence upon the states of the outputs of said probability generators.

Preferably, at least one of said probability generators comprises a pair of feedback shift registers, each of which is of length L and in which bits m and n of the register are logically combined and fed back to the input of the register, L, m and n being different for each register, and x bits of the pair of shift registers are compared to provide the respective pulse output of the probability generator.

Said logical combining may comprise an exclusive-OR function.

Preferably, two or more of said probability generators comprise a pair of feedback shift registers and a comparator as recited above, and the value of x is different for each probability generator.

Two or more of said probability generators may share the same pair of feedback shift registers but have a different respective comparator to provide a respective value of x which is different for each probability generator.

A pulse generator as above may be designed to simulate the output from a neutron well, wherein said first and second probability generators are designed to represent the values F and T respectively, wherein F represents the fraction of events in a random background that will have associated coincident pairs, and T a respective die-away time.

Where a third probability generator is provided, said first to third probability generators are designed to represent the values F, T and R respectively, wherein R represents the rate or frequency of the random background.

A pulse generator as above may include a counter for counting the number of output pulses of the pulse generator, which counter is incremented for each pulse representing a first of an associated coincident pair, and decreased for each pulse representing a second of an associated coincident pair, and the output of the counter is fed back to the third probability generator, to control the respective value of x for that generator.

A pulse generator as above may further include a plurality of said second probability generators, wherein F represents the fraction of events in the random background that will have associated coincident triplets, quadruplets, or higher orders.

According to another aspect of the present invention, there is provided a method of testing a neutron coincidence system, comprising the steps of simulating the output of a neutron well by means of a pulse generator according to any of the preceding aspects of the invention, and detecting the simulated output by means of the neutron coincidence system.

For a better understanding of the invention, and to show how embodiments of the same may be carried into effect, reference will now be made, by way of example, to the accompanying diagrammatic drawings, in which.

In one embodiment of the invention, a pulse generator seeks to emulate the pulse stream from a neutron coincidence well. It has three parameters which can be set by the user. These are, R the rate or frequency of the random background, F the fraction of these which will have associated coincident pairs and T the die-away time. The electronics may be implemented as a plug-in card for a personal computer (PC)—especially a portable PC. It may be controlled by a computer program which allows the operator to select the three parameters R, F and T.

Pseudo-random pulse trains can be generated by feedback shift registers. If the input to a shift register of length L is produced by the logical combination of the outputs of stages m and n of the shift register, it is possible to produce a pseudo-random sequence of all possible combinations of the output, L bit word. The values of L, m and n must be chosen carefully to achieve this. Tables of maximum length configurations are available in the literature known to those skilled in the art.

Figure 1:
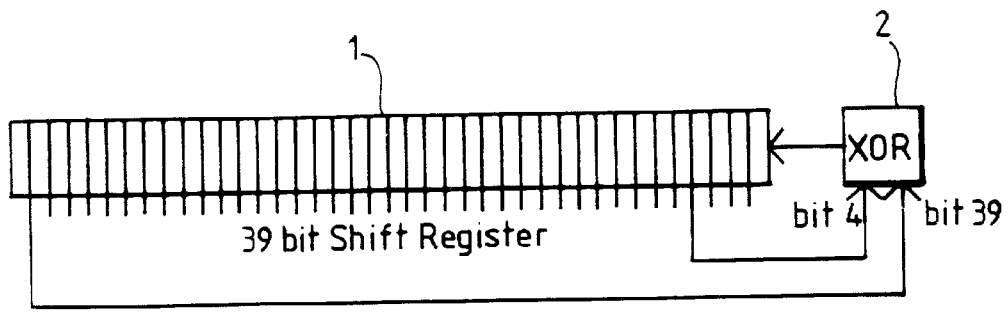
FIG. 1 shows a random word generator.

The shift register 1 shown in FIG. 1 has 39 bits, and its input comprises bits 4 and 39 which are exclusive-ORed by logic circuit 2. The register 1 will produce a pseudo-random sequence of length $2^{39-1}$. If clocked at 8 MHz this will repeat every 19 hours.

Figure 2:
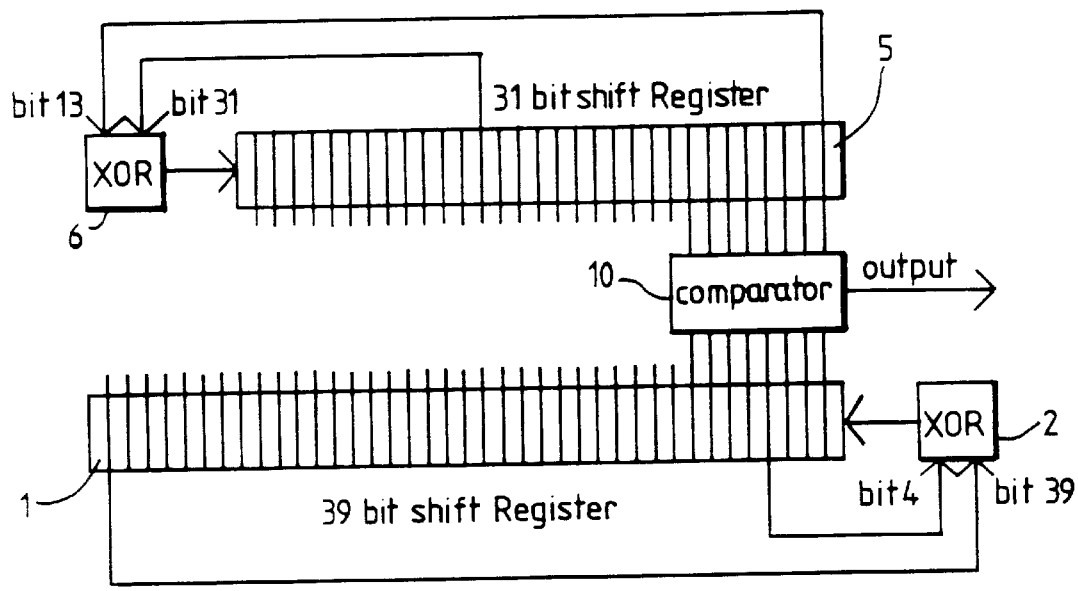
FIG. 2 shows a probability generator, using the random word generator of FIG. 1 and another, similar random word generator.

This is a random word generator. What is required is a random pulse, or probability generator. The circuit shown in FIG. 1 can be converted into a probability generator by comparing its output, or part of its output, with another random sequence generator. The second generator must generate a different random sequence from the first, This is achieved by using different values of L, m and n. By way of example, we may use L=31, m=31 and n=13, and FIG. 2 shows such a shift register 5, with exclusive-OR logic gate 6. The output sequence of the register 5 will be of length $2^{31-1}$ and will repeat in about 4 minutes. In combination of the registers 1 and 5, the length is effectively $2^{70-1}$ and the repeat time is 4.5 million years.

If 1 bit of each of the two shift registers are compared, there is a probability of 0.5 that they will agree. If the system is clocked at 8 MHz, then the output of the comparator is a pulse sequence at 4 MHz with an equal probability of the output being high or low. For every additional bit compared, the probability that they will agree and hence the mean frequency of the output is halved. For example, if 8 bits are compared, the output frequency is 8/256 MHz=31.25 KHz. This is shown in FIG. 2, where a comparator 10 compares the 8 bits.

It should be noted that the shift registers 1 and 5 must run in opposing directions so that all of the bits being compared change the bit with which they are compared, every clock cycle.

The probability generator shown in FIG. 2 may produce the random continuum R mentioned above and has been used for some years as a pseudo-random pulse generator in a variety of applications. The next task is to produce random correlated pairs with a random separation superimposed on the continuum.

Two further probability generators are required. The first is to select when a pair is to be produced and the second is to decide when the second pulse of a pair is to be generated once the first has been produced. Both probability generators are formed by comparing more bits of two feedback shift registers. These will control the parameters F and T. The same bit patterns must not be compared for more than one function as this will introduce unwanted correlations into the output pulse stream.

Figure 3:
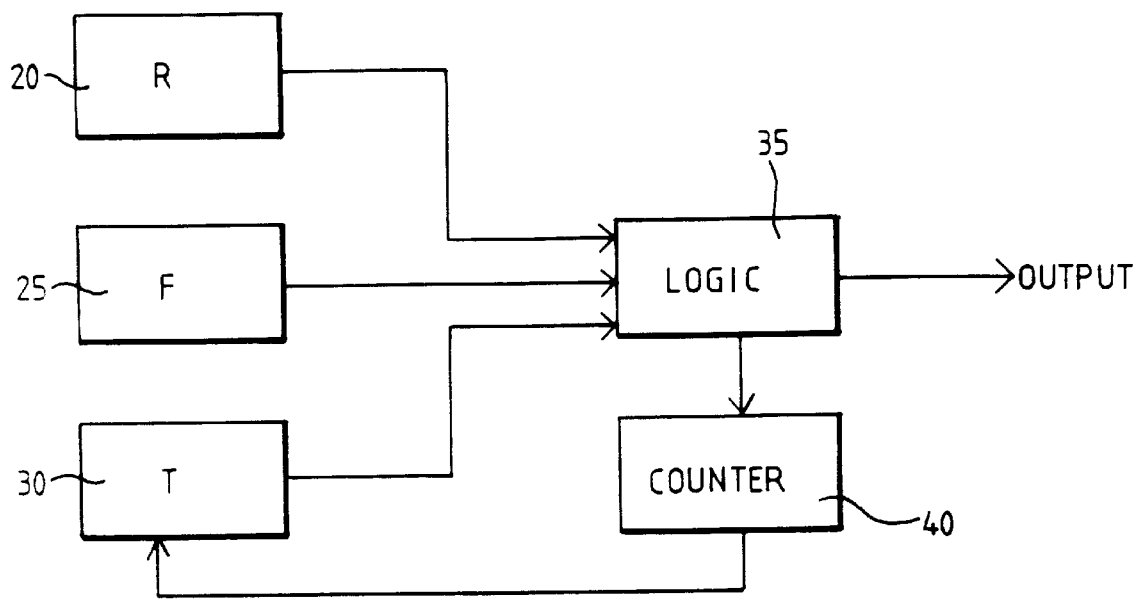
FIG. 3 shows a pseudo-random pulse generator.

A logic circuit is used to monitor the outputs of the three probability generators and produce an output pulse when necessary. This is illustrated in FIG. 3, where the outputs of R, F and T probability generators 20, 25 and 30 are input to a logic circuit 35, which provides an output pulse, and increments or decreases a counter 40, the output of which is fed back to the T probability generator 30. The operation of this is as follows.

An output occurs when the output of the R comparator=1.

When the output of the R comparator=1 and the F comparator=1, an output is generated and is deemed to be the first of a pair. An internal counter records the event.

If the internal counter shows a number greater than 1 and the T comparator=1 then an output is generated. The number on the internal counter is then reduced by one. This represents the generation of the second of the correlated pair of pulses. The time between the first and second pulses is determined by probability generator T.

The parameters R, F and T are decided by the user. This may be achieved by setting the number of bits from the shift registers which are compared in each probability generator. A simple parallel output facility may achieve this.

It is possible for the first pulse of a correlated pair to be generated before all of the second pulses of previous pairs have been produced. That is to say, the internal counter may contain numbers greater than 1. Each time that a first pulse is generated, the probability of generating a second pulse must increase accordingly. The probability of generating a second pulse must increase linearly with the number on the internal counter. This is achieved by using the output of the counter to control the number of bits being compared by the T probability generator. This is initially set by the user and is decreased by the output of the counter.

The effect of adding bits to or removing bits from a comparator is to alter the probability of an output by a factor of 2, for each bit involved. This is inconvenient because the output of the counter moves in units not in factors of 2. This linear control of the probability generator can be achieved by combining the output of several probability generators which have different probabilities. If we restrict the counter to the range 0 to 6 then the probabilities can be achieved with just two generators. These are combined as shown in Table 1 below. The two outputs are P1 and P2. P2 has twice the probability of P1. That is to say, it is formed by comparing one less bit than P1.

TABLE 1

| Counter output (D0 to D3) | Combination of P1 and P2 |
| --- | --- |
| 0 | P1 |
| 1 | P1 |
| 2 | P2 |
| 3 | P2 + P1 |
| 4 | 2.P2 |
| 5 | 2.P2 + P1 |
| 6 | 2.P2 + 2.P1 |
| >6 | ditto |

Figure 4:
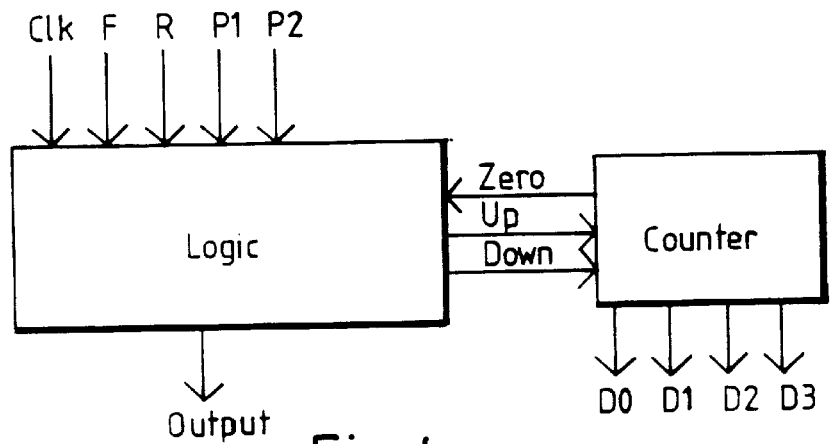
FIG. 4 is a logic diagram.

When the probabilities are shown multiplied by 2, the logic reduces the number of bits, being compared by that generator, by 1. A schematic of the logic is shown in FIG. 4.

A pulse generator has been built using these design principles and the performance of the device is summarised in Table 2 below.

TABLE 2

| | |
| --- | --- |
| Clock frequency | 8 MHz |
| Frequency range R | 976 to 125,000 pps |
| Fraction F, of R, which are pairs | 1 to 1/256 |
| Die-away time T | 4 to 512 microsecs |

If the rate of pair production R.F exceeds the rate at which the pairs can be produced, then the generator will produce invalid data. This will occur when high pair rates are combined with long die-away times. Software may be designed to offer only legal combinations of F,R and T to the user, and prevent the error happening in practice.

Figure 5:
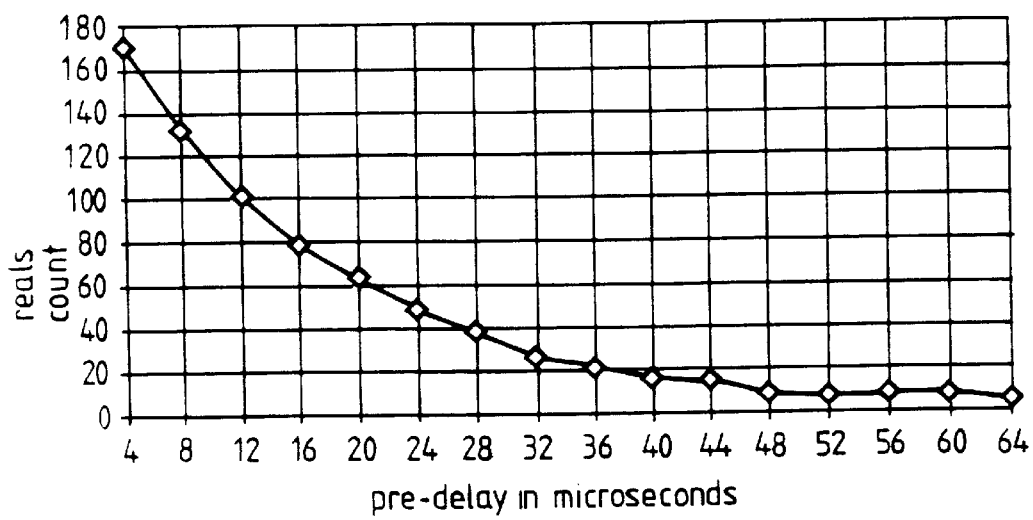
FIG. 5 is a graph to illustrate the output from a neutron coincidence system, when driven by one example of a pulse generator embodying the invention.

FIG. 5 is an illustration of the output from a neutron coincidence system (XYBASIC W6325) [J A Lightfoot and G Toon—A computer controlled, high performance, neutron coincidence counting system. Nuclear Instruments and Methods A271 (1988) 636–643)] when driven by the above mentioned pulse generator. The reals count is plotted as a function of pre-delay for R=1953 pps, F=½ and T=16 microseconds. The pre-delay is the time between the trigger event and the beginning of the coincidence gate. The gate length of the coincidence electronics was set to 4 microseconds.

As may be seen from the foregoing example, a "random coincidence" pulse generator has been designed and shown to work successfully. It may be used to test neutron coincidence systems in ways which were not previously possible and should improve the quality of such instruments.

Although prior proposals have been made to utilise feedback shift registers in random number or sequence generation, none are concerned with the controlled introduction of correlated pulses into a random stream (coincidences). Preferred embodiments of the invention introduce such events into the random stream, at a rate and characteristic correlation time which can be set by the user, and such that the time at which the correlated events occur and the time between the pairs of pulses are also both random.

Although the illustrated embodiments of the invention utilise shift registers, probability generators may be constructed in alternative ways—for example, by using digital signal processors.

Although the illustrated embodiments of the invention are for producing coincident pairs, further probability generators may be included, and their outputs logically combined, to produce triplets, quadruplets, and higher orders.

The reader's attention is directed to all papers and documents which are filed concurrently with or previous to this specification in connection with this application and which are open to public inspection with this specification, and the contents of all such papers and documents are incorporated herein by reference.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extends to any novel one, or any novel combination, of the features disclosed in this specification (including any accompanying claims, abstract and drawings), or to any novel one, or any novel combination, of the steps of any method or process so disclosed.

I claim:

1. A pulse generator comprising:
   a first probability generator for generating a first output comprising a first pulse stream having pulses which are output with a first probability;
   a second probability generator for generating a second output comprising a second pulse stream having pulses which are output with a second probability; and
   a logic circuit for combining the outputs of said first and second probability generators and configured to produce an output pulse stream to simulate the output from a neutron well, the pulse stream having output pulses in dependence upon the states of the outputs of said probability generators;
   wherein said first and second probability generators are designed to represent the values F and T respectively, wherein F represents the fraction of events in a random background that will have associated coincident pairs, and T represents a respective die-away time.

2. A pulse generator according to claim 1, further comprising a third probability generator for generating a third output comprising pulses which are output with a third probability, the logic circuit being arranged to combine the outputs of said first, second and third probability generators to produce an output pulse in dependence upon the states of the outputs of said probability generators.

3. A pulse generator according to claim 2, wherein said third probability generator is designed to represent the value R, wherein R represents the rate or frequency of the random background.

4. A pulse generator according to claim 3, including a counter for counting the number of output pulses of the pulse generator, which counter is incremented for each pulse representing a first of an associated coincident pair, and decreased for each pulse representing a second of the associated coincident pair, and an output of the counter is fed back to the third probability generator.

5. A pulse generator according to claim 3, further including a plurality of said second probability generators, wherein F represents the fraction of events in the random background that will have associated coincident triplets, quadruplets, or higher orders.

6. A pulse generator having an overall output and comprising:
   a first probability generator for generating a first output, said first output comprising a pulse stream of pulses, said pulses being outputted with a first probability;
   a second probability generator for generating a second output, said second output comprising a pulse stream of pulses, said pulses being outputted with a second probability;
   a logic circuit receiving said first output and said second output, said logic circuit providing an overall output, a pulse in the first output resulting in a count pulse, said overall output comprising the pulse stream of the first output and one or more count pulses, the count pulses being spaced relative to the pulses of the first output according to the pulse stream of the second output.

7. A pulse generator according to claim 6, in which said overall output comprises a count pulse for each pulse in the first output.

8. A pulse generator according to claim 6 in which the pulses of the first output in the overall output equate to the first pulses of coincidence pulse pairs.

9. A pulse generator according to claim 6 in which the count pulses in the overall output equate to the second pulses of coincidence pulse pairs.

10. A pulse generator according to claim 6 in which the pulse stream of the second probability generator determines the spacing between the first and second pulses of coincidence pulse pairs, the spacing equating to time.

11. A pulse generator according to claim 6 in which the first probability relates to a mean frequency of coincidence pairs of pulses and the second probability relates to a die-away time.

12. A pulse generator according to claim 6, wherein at least one of said probability generators comprises first and second feed back shift registers, each register comprising a number of stages L, in each register an output of a first stage being bit m and an output of a second stage being bit n, said bits m and n forming inputs to a logic circuit, said logic circuit logically combining said bits m and n to form an output, the output of said logic circuit forming an input to the register from which said bits m and n were output, wherein L, m and n are different for said first and second registers, wherein a number of stages of said first register provide a number of outputs having x bits, a number of stages of said second register provide a number of outputs having x bits, and said x bits from said first register and said x bits from said second register form inputs to a comparator, and wherein said comparator provides the pulse output of the at least one of said probability generators.

13. A pulse generator according to claim 12 in which said logical combining comprises an exclusive-OR function.

14. A pulse generator according to claim 12 in which two or more of said probability generators comprise a pair of shift registers, the value of x being different for each probability generator.

15. A pulse generator according to claim 14 in which two or more of said probability generators share the same pair of feedback shift registers, but have a different respective comparator to provide a respective value of x which is different for each probability generator.

16. A pulse generator having an overall output and comprising:
 a first probability generator for generating a first output, said first output comprising a pulse stream of pulses, said pulses being outputted with a first probability;
 a second probability generator for generating a second output, said second output comprising a pulse stream of pulses, said pulses being outputted with a second probability;
 a third probability generator for generating a third output, said third output comprising a pulse stream of pulses, said pulses being outputted with a third probability; and
 a logic circuit receiving said first output, said second output and said third output, said logic circuit comparing the first and third outputs to determine coincident pulses there between, a coincident pulse resulting in a count pulse, said logical circuit providing said overall output, said overall output comprising the pulse stream of the third output and one or more count pulses, the count pulses being spaced relative to the pulses of the third output according to the pulse stream of the second output.

17. A pulse generator according to claim 16, in which said overall output comprises a count pulse for each coincident pulse between the first and third output.

18. A pulse generator according to claim 16 in which the coincident pulses of the first and third outputs equate to the first pulses of coincidence pulse pairs.

19. A pulse generator according to claim 16 in which the count pulses in the overall output equate to the second pulses of coincidence pulse pairs.

20. A pulse generator according to claim 16 in which the pulse stream of the second probability generator determines the spacing between the first and second pulses of coincident pulse pairs, the spacing equating to time.

21. A pulse generator according to claim 16 and designed to simulate the output from a neutron well, in which the first probability relates to the fraction of events in a random background that will give rise to coincident pairs, the second probability relates to the die away time and the third probability relates to the mean random background frequency.

22. A pulse generator according to claim 16, wherein at least one of said probability generators comprises first and second feed back shift registers, each register comprising a number of stages L, in each register an output of a first stage being bit m and an output of a second stare being bit n, said bits m and n forming inputs to a logic circuit, said logic circuit logically combining said bits m and n to form an output, the output of said logic circuit forming an input to the register from which said bits m and n were output, wherein L, m and n are different for said first and second registers, wherein a number of stages of said first register provide a number of outputs having x bits, a number of stages of said second register provide a number of outputs having x bits, and said x bits from said first register and said x bits from said second register form inputs to a comparator, and wherein said comparator provides the pulse output of the at least one of said probability generators.

23. A pulse generator according to claim 22 in which said logical combining comprises an exclusive-OR function.

24. A pulse generator according to claim 22 in which two or more of said probability generators comprise a pair of shift registers, the value of x being different for each probability generator.

25. A pulse generator according to claim 24 in which two or more of said probability generators share the same pair of feedback shift registers, but have a different respective comparator to provide a respective value of x which is different for each probability generator.

26. A pulse generator according to claim 16, including a counter for counting output pulses of the pulse generator, which count is incremented for each pulse representing the first of a pair of coincident pulses and is decreased for each pulse representing the second of a pair of coincident pulses, the output of the counter being fed back to the second probability generator to control the respective number of x for that generator.

27. A pulse generator according to claim 26 in which the output from the counter varies with the balance of the counter, the higher the balance, the higher the value of x.

28. A method of testing a neutron coincidence system, comprising: generating a series of pulses forming a total output by means of one or more pulse generators, said total output being the combined overall output(s) of said one or more generators, wherein at least one of said pulse generators comprises a pulse generator having an overall output and comprising:
 a first probability generator for generating a first output, said first output comprising a pulse stream of pulses, said pulses being outputted with a first probability;
 a second probability generator for generating a second output, said second output comprising a pulse stream of pulses, said pulses being outputted with a second probability; and
 a logic circuit receiving said first output and said second output, said logic circuit providing an overall output, a pulse in the first output resulting in a count pulse, said overall output comprising the pulse stream of the first output and one or more count pulses, the count pulses being spaced relative to the pulses of the first output according to the pulse stream of the second output; said total output simulating the output of a neutron well and forming an input for a neutron coincidence system.

* * * * *

UNITED STATES PATENT AND TRADEMARK OFFICE
CERTIFICATE OF CORRECTION

PATENT NO. : 5,841,680
DATED : 11/24/98
INVENTOR(S) : Lightfoot

It is certified that error appears in the above-identified patent and that said Letters Patent is hereby corrected as shown below:

On the title page, after item [22] Filed: Jul. 28, 1995" insert

```
--Foreign Application Priority Data
Jul. 30, 1994 [GB]    United Kingdom        9415432.5--
```

Signed and Sealed this

Sixth Day of July, 1999

Attest:

Attesting Officer

Q. TODD DICKINSON

Acting Commissioner of Patents and Trademarks